United States Patent [19]
Burke et al.

[11] Patent Number: 5,226,962
[45] Date of Patent: Jul. 13, 1993

[54] FLUX APPLICATOR SYSTEM

[75] Inventors: Richard A. Burke, Salem, N.H.;
Charles R. Lowell, Concord, Mass.;
Janet R. Sterritt, Hollis, N.H.

[73] Assignee: Electrovert U.S.A. Corp.,
Providence, R.I.

[21] Appl. No.: 789,301

[22] Filed: Nov. 8, 1991

[51] Int. Cl.$^5$ .............................................. B05B 7/00
[52] U.S. Cl. .................................... 118/74; 118/314
[58] Field of Search ............... 427/310; 118/74, 314, 118/313

[56] References Cited

U.S. PATENT DOCUMENTS 5,005,514  4/1991  Verrico .............................. 118/313
5,063,874  11/1991 Dodds et al. ....................... 118/326

Primary Examiner—W. Gary Jones
Assistant Examiner—Charles K. Friedman
Attorney, Agent, or Firm—Hayes, Soloway, Hennessey & Hage

[57] ABSTRACT

A system for spraying accurately controlled quantities of a liquid mixture of two or more fluids from a plurality of fixedly positioned spray nozzles is disclosed. The nozzles are spaced to provide a substantially uniform flow pattern over a predetermined width. The fluids are supplied to separate manifolds and are distributed to the nozzles by separate feed lines running from the manifolds. All of the feed lines from a given manifold are of equal length to maintain essentially identical pressure drops. A holding tank is provided in the line between a fluid supply and its manifold to provide a fixed static pressure head from which to draw fluid.

5 Claims, 4 Drawing Sheets

FLUX APPLICATOR SYSTEM

BACKGROUND OF THE INVENTION

The present invention relates generally to improvements in liquid coating techniques, and more particularly to an improved apparatus and method for applying a controlled amount of a liquid to a substrate such as a printed circuit board. The invention has particular utility in the application of a fluid solder flux to a printed circuit board which is to be mass soldered and will be described in connection with such utility, although other utilities are contemplated.

Commercially available mass soldering systems include a conveyor system for conveying a printed circuit board along a path through various work stations. The printed circuit board has components mounted thereon with leads positioned adjacent lands to which the leads are to be soldered.

In a typical mass soldering system, a liquid solder flux is applied to a solder board prior to soldering. The board is then preheated to activate the flux, and the preheated board is then passed through the mass soldering station. Preheating also serves to evaporate flux solvent, and reduce thermal shock. The flux serves both as a cleaning and wetting agent to enhance the quality of the solder joint formed between the component leads and circuit board lands.

Several flux application methods have been used historically in the industry. One method pumps flux through a nozzle to form a standing of wave of flux fluid through which the bottom surface of the board is passed. Another popular method is to aerate the fluid flux to produce bubbles which rise up to wet the bottom surface of the board. However, both of these methods do not allow good control over the amount of flux deposited on the board. Another method and one which can be used to apply very small amounts of flux to the bottom side of the board is spraying. One method of spraying flux is to rotate a mesh drum through a bath of flux and then blow air through the mesh to create a mist of flux. While such prior art fluxing systems have achieved commercial success, such systems suffer from disadvantage of evaporation of flux solvent during use. Evaporation of the flux solvent results in a progressive change in specific gravity of the flux. As time goes on, the relative solid content of the flux increases with the result that more solids may be applied to and remain on the board. Generally, the preheaters are set to flash off the flux solvent and preheat the printed circuit board to activate the flux and reduce thermal shock. However, as the flux deposit increases, the deposited flux takes more of the heat, leaving less for activating flux and less for reducing thermal shock. This results in variation in the soldering process and potentially poor solder joints. Another result of uncontrolled solvent evaporation is increased flux consumption because dragout on the boards is greater. Excessive flux consumption means increased flux and cleaning costs. While solvent evaporation can be compensated for by periodically adding solvent, variation in flux concentration remains a problem.

More recently several manufacturers have introduced closed system spray fluxing systems employing either a single spray nozzle on a moveable arm, or a plurality of fixed spray nozzles. Since such commercially available spray fluxing systems are closed systems and thus solve the problem of solvent evaporation and resulting density variation, flux application uniformity has not proven to be entirely satisfactory. Moreover, single nozzle systems are relatively mechanically complicated. Also, such commercially available closed system spray fluxing systems employ pressurized vessels. This presents a potential safety hazard, and many local fire safety codes may not permit flammable fluids to be stored in a reservoir under pressure.

It is accordingly an object of the present invention to overcome the aforesaid and other problems of the prior art.

Another object of the present invention is to provide a novel spray fluxing system, i.e. apparatus and method, capable of accurately and uniformly depositing flux onto a printed circuit board.

SUMMARY OF THE INVENTION

The present invention provides a system for spraying accurately controlled quantities of a liquid mixture of two or more fluids, from a plurality of fixedly positioned spray nozzles. The nozzles are spaced to provide a substantially uniform flow pattern over a predetermined width. The fluids are supplied to separate manifolds and are distributed to the nozzles by separate feed lines running from the manifolds. All of the feed lines from a given manifold are of equal length to maintain essentially identical pressure drops. In a preferred embodiment of the invention, a holding tank is provided in the line between a fluid supply and its manifold to provide a fixed static pressure head from which the draw fluid.

BRIEF DESCRIPTION OF THE DRAWINGS

Other features and advantages will become apparent from the following detailed description of the invention and the accompanying drawings in which like numerals designate like parts, and in which.

DETAILED DESCRIPTION OF THE INVENTION

The present invention employs a plurality of fixedly positioned spray nozzles. The nozzles are spaced to provide an overlapping gausian distribution from each nozzle. The nozzles are spaced to yield a uniform flow pattern over the width of the printed circuit board. When employed in connection with application of flux in a mass wave soldering system, the plurality of nozzles is placed under the travel path of the printed circuit board to be soldered. Preferably the nozzles atomize fluid through the use of a gas. The nozzles each are fed by two or more fluids, such as flux and a flux solvent, and an atomizing gas, such as air or nitrogen.

The fluids are fed from supplies to separate manifolds and are distributed to each of the individual nozzles by separate lines running from the two manifolds. The manifolds serve to equalize the pressure to the nozzles. All of the lines connecting a manifold to a nozzle are of equal length to maintain similar pressure drops. The atomizing gas is separately fed to each nozzle.

The nozzles may be individually turned on and off to accommodate different board widths. A holding tank in the supply line to the manifold provides fixed static pressure head from which fluid is drawn.

DETAILED DESCRIPTION OF A PREFERRED EMBODIMENT OF THE INVENTION

Figure 1:
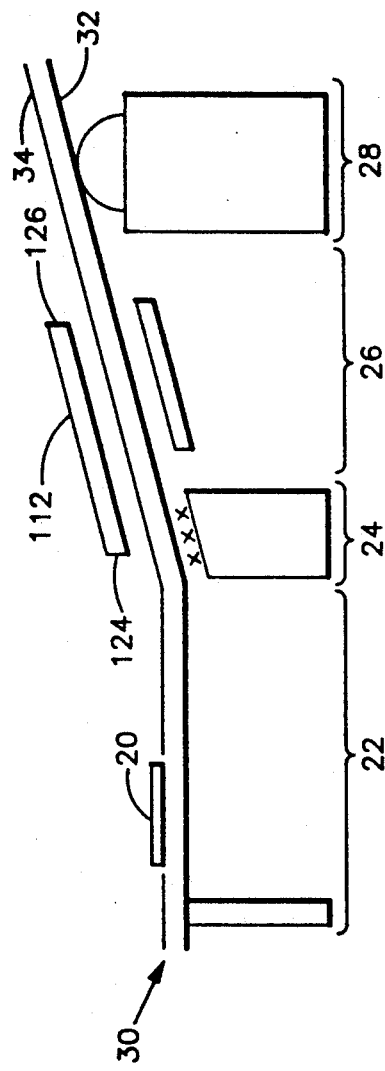
FIG. 1 is a side elevational view illustrating a mass soldering system incorporating a fluid spray system in accordance with the present invention.

Referring now to the drawings, one preferred embodiment of the present invention will be described in the context of a wave soldering apparatus. Referring first to FIG. 1, a printed circuit board 20 is loaded at an insertion station 22, with a plurality of electrical or electronic components at predetermined positions on the board.

The next step involves treating the surfaces to be soldered with a so-called flux at a fluxing station 24. Fluxing station 24 comprises a spray fluxing station as will be described in detail hereinafter.

The board is then passed from fluxing station 24 to a preheating station 26 where the board is preheated to activate the flux and to drive off the bulk of the flux solvent to form an active flux layer on the board and leads. Preheating station 26 may comprise infrared or convection heaters or a combination of infrared and convection heaters as are well known in the art.

The fluxed preheated board is then passed to a mass wave soldering station 28 which station also is of conventional construction.

Completing the soldering system is a circuit board conveyor 30 of conventional construction. The latter comprises a pair of spaced conveyor rails 32 and 34 and suitable drive means (not shown) for carrying a circuit board from the inserting station 22 through fluxing station 24, preheating station 26 and wave soldering station 28.

Referring to FIGS. 2-5 of the drawings, the novel spray fluxing system of the present invention comprises a first container 36 for holding a supply of liquid flux 38, and a second container 40 for holding a supply of a flux solvent 42. Typically, in the case of a low residue organic flux the solvent comprises a lower alcohol or the like. For ease of operation and maintenance flux container 36 and solvent container 40 may comprise the original flux and solvent bottles or carboys Alternatively, containers 36 and 40 may comprise fixed (refillable) tanks or the like.

The liquid flux is withdrawn from container 36 via a conduit 44 and through check valve 45 and is delivered via a pump 46 through a conduit 48 and filter 49 to a flux holding tank 50. Pump 46 is controlled by flux operational/low level switch 52 and high level switch 54 mounted in a side wall the tank 50. An overflow conduit 56 is mounted in a side wall of holding tank 50 adjacent the top end of the tank. As will become apparent from the description following, holding tank 50 provides a fixed static pressure head from which to draw flux.

Flux is withdrawn from holding tank 50 via conduit 58 mounted in a side wall of the holding tank 50 adjacent the bottom end of the tank, and is pumped via a pump 60 and conduit 62 having a first fixed flow restrictor 63 to a second wye 64 which directs a portion of the flux to one manifold 98a of the nozzle assembly 66 via a branch conduit 68, and directs the remainder of the flux to the inlet of a control valve 70 via branch conduit 72. A pressure transducer 85 is provided in conduit 68 for measuring flux pressure in the conduit. The outlet side of control valve 70 is connected to a conduit 74 for returning flux to tank 50. A recirculation loop comprising a first wye 75, branch conduit 76, and a second fixed flow restrictor 77 is provided upstream of second wye 64 for trimming the pressure drop in the recirculation loop to provide an appropriate pressure which can then be further modified by the operator through adjustment of the pressure control valve 70 to provide a range of flux application pressures to accommodate flux type, conveyor speed, etc. A system flux drain 79 in the bottom of container 50 permits flushing the system. Pump 60 has a capacity many times that of pump 46. Pump 46 supplies flux as make-up for that used by the nozzles, and runs occasionally to restore the level in the reservoir 50. Pump 60 supplies flux at about 100 times the flow of that used by the nozzles so that the impact of the nozzle flow on the pressure drop around the recirculation loops will be negligible.

The flux solvent is withdrawn from container 40 via a conduit 78, through filter 81 and check valve 83 and is delivered via a pump 80 and conduit 82 to the other manifold 98b of the nozzle assembly 66. A wye 84 is located in conduit 82 for delivering flux solvent via conduit 86 to manifold 98a as will be described hereinafter. Another wye 88 upstream of wye 84 returns flux solvent to solvent container 40 via a conduit 90.

Finally, compressed gas such as air, nitrogen or the like is fed from a source 92 via conduit 94 through pressure control switch 96 and pressure regulator 97. The gas is then passed through a gas feed solenoid valve 99 and check valve 101 to the nozzle assembly 66. A pressure gauge 103 is provided for monitoring gas pressure.

Figure 3:
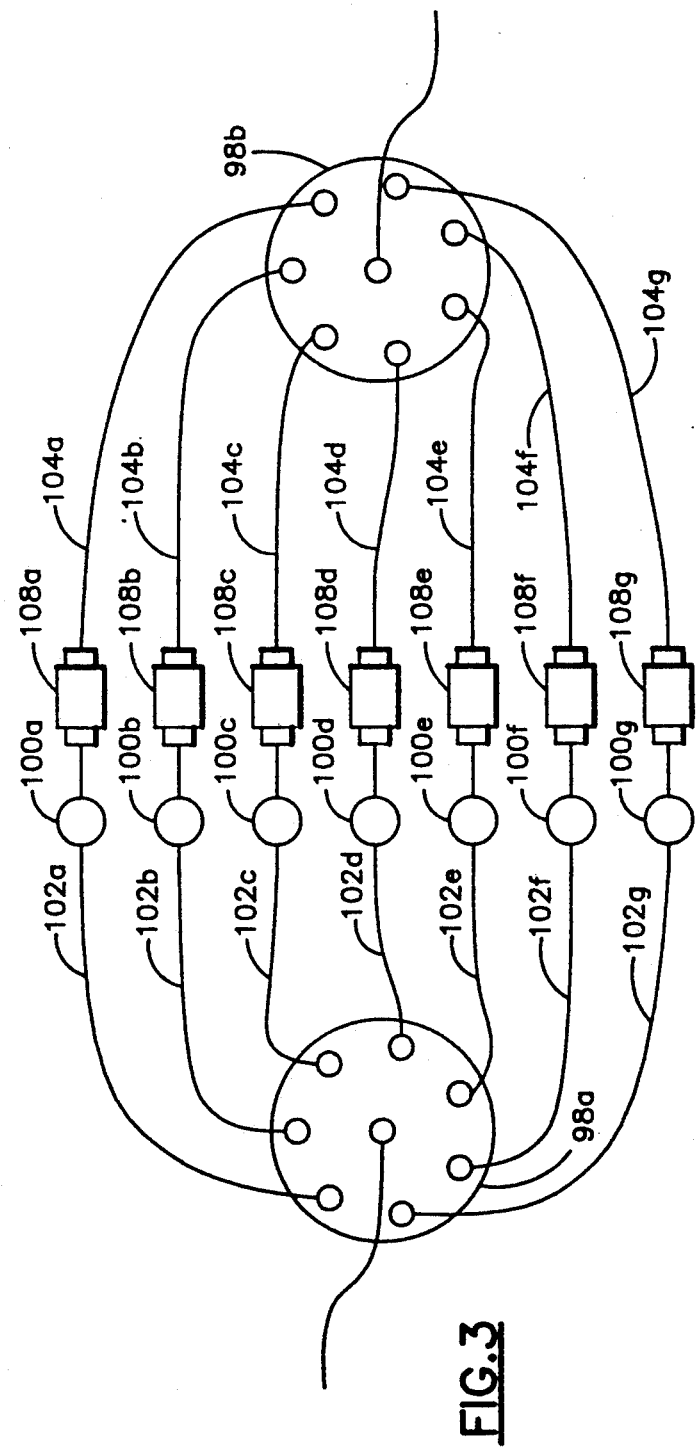
FIG. 3 is a schematic diagram showing details of the nozzle/manifold assembly portion of the fluid spray of the present invention.
Figure 2:
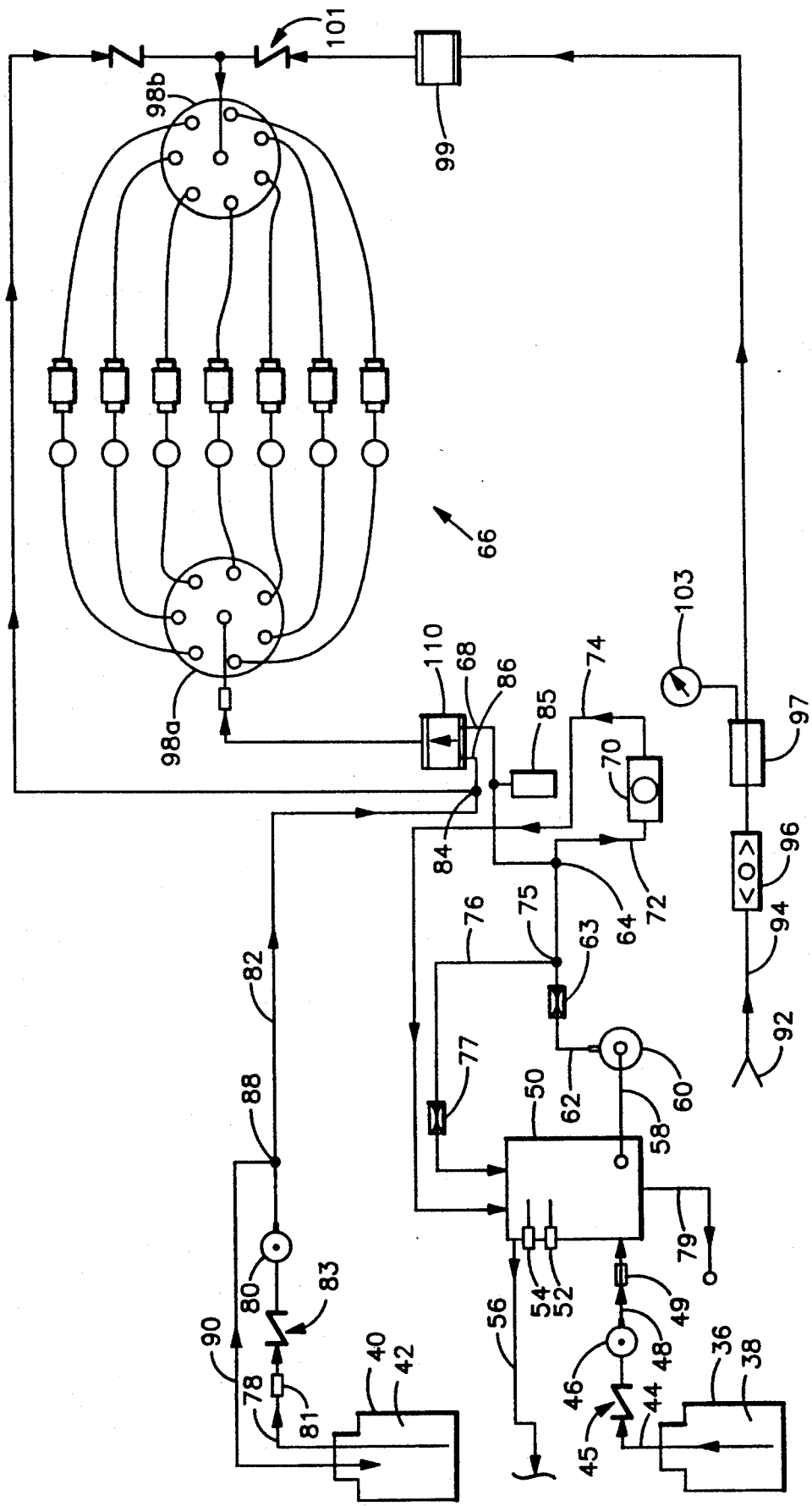
FIG. 2 is a schematic diagram illustrating details of a fluid spray system of the present invention.

Referring in particular to FIG. 3, the nozzle assembly, in a preferred embodiment comprises two manifolds 98a, 98b for delivering the flux and solvent and pressurized air to spray nozzles 100a...g, via lines 102a...g and 104a...g, respectively. In a preferred embodiment of the invention nozzles 100a...g are each supplied with separate solenoid valve means 108a...g immediately upstream of the nozzles so that the nozzles may be selectively turned on and off.

Completing the nozzle assembly is a three-way valve 110 for selectively delivering flux or solvent to manifold 98a, for example for servicing of the system. The entire system or the nozzles alone may be cleaned by selectively applying either a system purge or a nozzle purge, respectively. During a system purge, for example at the end of the day or to change flux, a large amount of solvent is supplied through three-way valve 110 to flux manifold 98a, thereby replacing the flux in the nozzles with solvent. In a nozzle purge, a relatively small amount of solvent is flowed into the gas manifold 98b between flux applications, so as to clean the nozzle of encrusted flux. Nozzle purge preferably is performed periodically, that is, after a predetermined number of circuit boards have passed through the system, as a preventive measure.

Nozzles 100a...g preferably are conventional external mixing nozzles. One commercially available mixing nozzle we have found to be particularly effective, and which provides particularly uniform spray is nozzle No. E18B available from Spraying Systems Company of Wheaton, Ill.

In order to insure equalized pressure from the manifold to each nozzle, the tubes running between the manifolds in each nozzle are of equal length and internal diameter so as to maintain essentially identical pressure drops.

Figure 4:
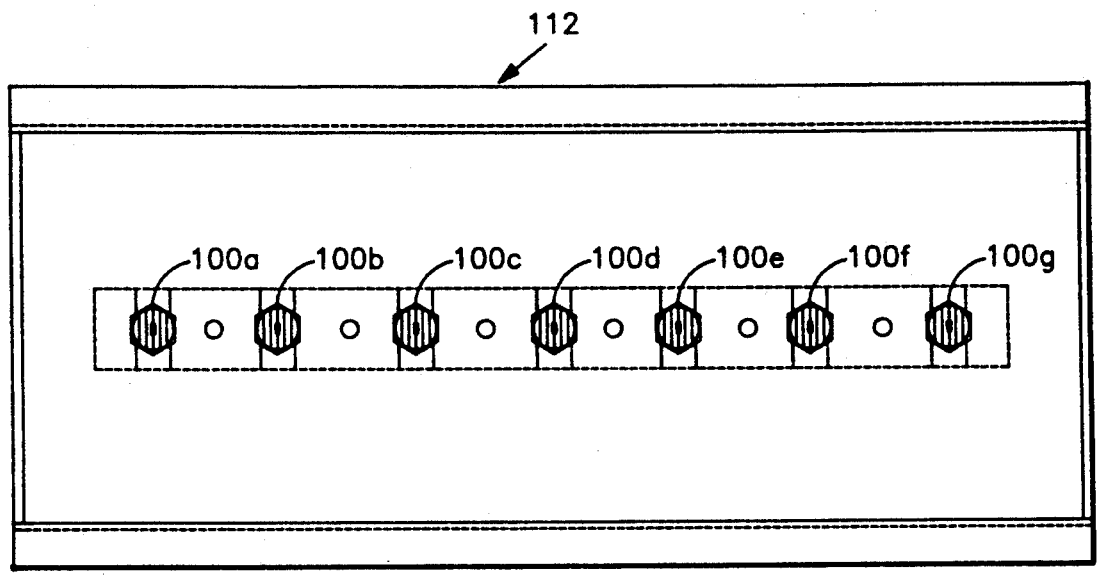
FIG. 4 is a top plan view of a preferred form of nozzle assembly in accordance with the present assembly.
Figure 5:
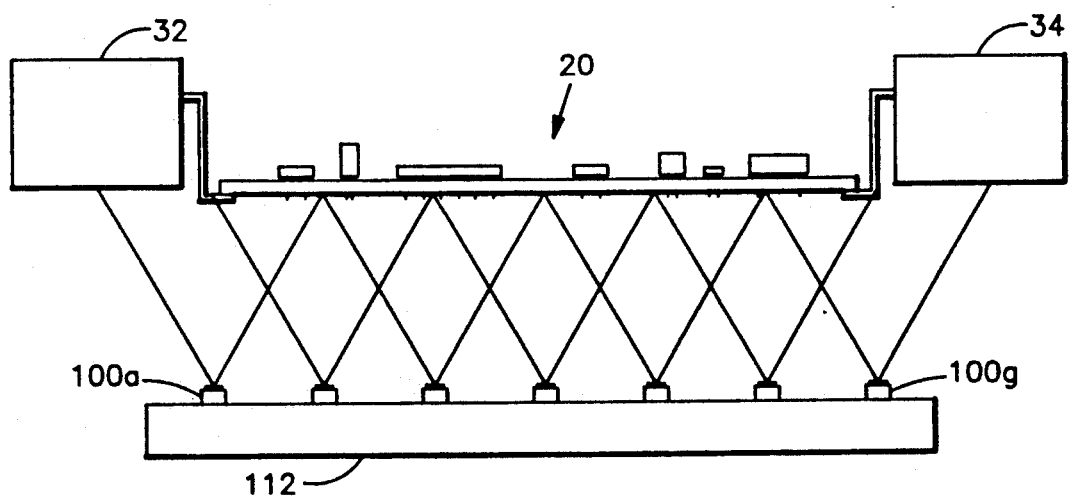
FIG. 5 is a side elevational view illustrating the spray fluxer applying flux to a printed circuit board in accordance with the present invention.
Figure 6:
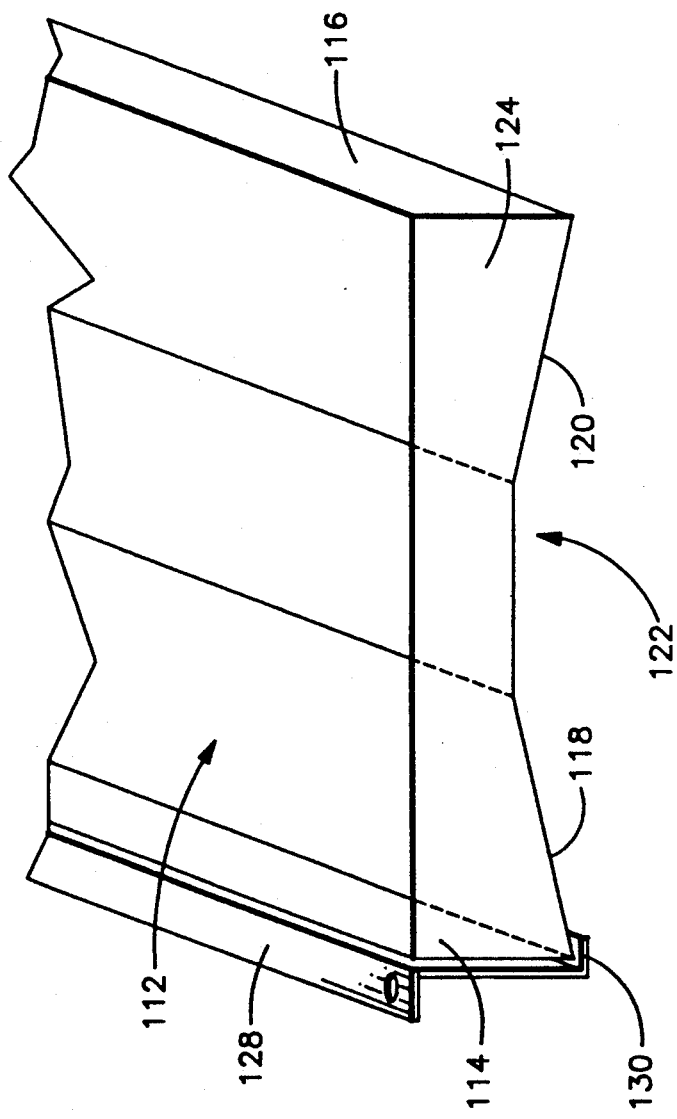
FIG. 6 is a perspective view of an exhaust drip tray particularly adapted for use with the spray flux applicator in accordance with the present invention.

Referring also to FIG. 4, nozzles 100a...g preferably are uniformly spaced in a straight line in fixed positioned on a nozzle assembly bracket 112 positioned below the travel path of the printed circuit boards being processed. Valves 108a...g permit the control of the width of the spray, i.e., by closing one or more outward bound valves so that the spray pattern may be adjusted to the width of the printed circuit boards being processed.

The feature and advantage of the present invention is to provide uniform distribution of flux while employing multiple spraying nozzles. The ability to maintain uniform distribution from multiple spraying nozzles requires providing the uniform fluid pressure to all the nozzles during start-up, throughout spraying intervals, and independent of the number of nozzles as may be activated. This ability results in part from the use of internal reservoir which acts as a buffer to maintain constant pressure over time regardless of fluid draw due to varying number of nozzles engaged. By employing pumps 46 and 60 of capacity greater than the potential draw of all the nozzles, it is possible to maintain a substantially constant level in holding tank 50, with excess pumped flux being returned to the holding tank via the return loop conduits 74 and 76. Thus, nozzles may be turned on or off to accommodate board width changes without the need to readjust pressure to accommodate varying numbers of nozzles.

In operation, the spray preferably is cycled off between boards to conserve flux and solvent. Cycling is accomplished by activating air solenoid valve 99 and any of nozzle solenoids 108a-g as required, and in relationship to the position of the board relative to the nozzles, for example, using board position sensors or the like well known in the art.

A feature and advantage of the present invention is the ability to accurately control uniform application of flux. Moreover, because flux may be accurately and uniformly controlled, the flux may be applied in minimum amounts necessary to accomplish the desired cleaning. Applying flux in minimum amount is desirable in that it reduces the potential for residual flux remaining after soldering and may eliminate the need for post-solder cleaning. With this goal in mind, we have designed an exhaust system which has particular utility in reducing or eliminating flux drip onto the top side of the board during the soldering process. In a conventional mass soldering system vaporized flux may recondense on the top side of the board, thus necessitating a secondary (post soldering) cleaning step. In order to eliminate this problem, in accordance with another and preferred embodiment of our invention, we have provided a novel and improved exhaust system employing an active sweeping air stream and novel exhaust manifold designed to capture flux droplets. The exhaust manifold comprises an elongate generally rectangular hollow structure having a top wall 112, side walls 114 and 116 and upwardly sloping bottom walls 118 and 120 which terminate short of the midway point of the conduit 112 leaving an elongate, relatively narrow gap 122 between end walls 124 and 126.

Receiving brackets 128 (only one of which is shown) having angled receiving lips 130 are provided adjacent the lower outside edges of the exhaust manifold to support the manifold and drain away condensed flux droplets. The exhaust manifold communicates via an overhead outlet (not shown) to an exhaust fan of conventional construction (not shown) for creating an active air stream. In use, vaporized flux and flux overspray is picked up in the active air stream and drawn away from the printed circuit board by the air flow. Flux vapors and droplets are carried upwardly by the air flow, and the vapors, and the bulk of the droplets are exhausted from the system or adhere to sloping bottom walls 118 and 120. The flux droplets then flow by gravity to the gutter formed receiving by lips 130 where the accumulating flux may then be drawn off by gravity for collection and disposal.

Various changes may be made in the foregoing invention without parting from the spirit and scope of the invention. For example, the spray nozzles need not be arranged equally spaced in a straight line.

What is claimed is:

1. Apparatus for spraying a liquid flux onto a printed circuit board prior to wave soldering of the printed circuit board, comprising means for passing the printed circuit board over a plurality of spray nozzles for the flux, the spray nozzles being arranged transversely across the path of the printed circuit board, a pump for pumping flux from a supply thereof to a manifold for supplying said nozzles, a separate line connecting the manifold to each said nozzle, each line being arranged to provide equal pressure at each nozzle, the flow capacity of the pump for pumping the flux to the manifold being many times greater than the flow capacity of all of the nozzles, and means for recycling to the supply excess flux pumped by the pump.

2. The apparatus according to claim 1 wherein the flow capacity of the pump supplying flux to the manifold has a capacity at least an order of magnitude greater than the flow capacity of all of the nozzles so that the impact of pressure drop in the flux due to the flow through a nozzle has a negligible impact on the pressure in the recirculating flux and the flux flow through each nozzle is maintained constant despite the number of nozzles in operation.

3. Apparatus according to claim 1 wherein at least two separate liquids are fed from separate supplies, said two liquids being supplied to separate manifolds, one of the liquids being the solder flux and the other liquid being a solvent therefore.

4. The apparatus of claim 1 wherein a cut off valve is provided in each line from the manifold to each spray nozzle.

5. The apparatus of claim 1 wherein a pressure control valve is provided for controlling pressure in the flux being fed to the manifold and recycles excess flux flow to maintain a constant pressure in the manifold.

* * * * *